US012781378B2

(12) United States Patent
Xiang et al.

(10) Patent No.: US 12,781,378 B2
(45) Date of Patent: Nov. 3, 2026

(54) MANUFACTURING METHOD FOR SINGLE-CRYSTAL SILICON ROD AND SINGLE-CRYSTAL FURNACE

(71) Applicants: JINKO SOLAR CO., LTD., Shangrao (CN); SICHUAN JINKO SOLAR CO., LTD., Leshan (CN)

(72) Inventors: Peng Xiang, Shangrao (CN); Ziyang Ou, Shangrao (CN); Xufan Li, Shangrao (CN); Yonghui Li, Shangrao (CN); Yuang Yang, Shangrao (CN)

(73) Assignees: JINKO SOLAR CO., LTD., Shangrao (CN); SICHUAN JINKO SOLAR CO., LTD., Leshan (CN)

( * ) Notice: Subject to any disclaimer, the term of this patent is extended or adjusted under 35 U.S.C. 154(b) by 207 days.

(21) Appl. No.: 18/393,751

(22) Filed: Dec. 22, 2023

(65) Prior Publication Data

US 2025/0109520 A1 Apr. 3, 2025

(30) Foreign Application Priority Data

Sep. 28, 2023 (CN) ........................ 202311278960.X
Sep. 28, 2023 (CN) ........................ 202322663362.6
Sep. 28, 2023 (CN) ........................ 202322663792.8

(51) Int. Cl.
*C30B 15/02* (2006.01)
*C30B 15/14* (2006.01)
*C30B 29/06* (2006.01)

(52) U.S. Cl.
CPC .............. *C30B 15/02* (2013.01); *C30B 15/14* (2013.01); *C30B 29/06* (2013.01)

(58) Field of Classification Search
CPC ......... C30B 15/02; C30B 15/14; C30B 29/06; Y10T 117/1056
See application file for complete search history.

(56) References Cited

U.S. PATENT DOCUMENTS

| | | | |
|---|---|---|---|
| 8,172,943 B2 | 5/2012 | Ohkubo | |
| 2019/0017191 A1* | 1/2019 | Kang | C30B 15/305 |
| 2021/0010152 A1* | 1/2021 | Shen | C30B 15/14 |

FOREIGN PATENT DOCUMENTS

| | | |
|---|---|---|
| CN | 101864591 B | 2/2012 |
| CN | 203653744 U | 6/2014 |
| CN | 215976130 U | 3/2022 |
| CN | 218772473 U | 3/2023 |

(Continued)

OTHER PUBLICATIONS

Partial European Search Report issued in corresponding EP Application 24150975.1, issued Apr. 1, 2025 (14 pages).
Patent Search Report; Date of Mailing: Jul. 11, 2023(16 pages).

*Primary Examiner* — Robert M Kunemund
(74) *Attorney, Agent, or Firm* — Wiersch Law Group

(57) ABSTRACT

A manufacturing method for a single-crystal silicon rod and a single-crystal furnace. The single-crystal silicon rod is pulled through a single-crystal furnace, and a crucible of the single-crystal furnace has a depth ranging from 680 mm to 800 mm. The manufacturing method for a single-crystal silicon rod includes: initially charging a silicon material to the crucible, wherein a contact area between the silicon material in the crucible and the crucible is a, a contact area between a liquid level of the silicon material in the crucible and the outside is b, and $1.2 \leq a/b \leq 3.7$.

20 Claims, 8 Drawing Sheets

(56) References Cited

FOREIGN PATENT DOCUMENTS

| | | | | |
|---|---|---|---|---|
| CN | 116377563 | B | | 9/2023 |
| JP | 2010241620 | A | * | 10/2010 |
| WO | 2009104533 | A1 | | 8/2009 |
| WO | 2022065738 | A1 | | 3/2022 |

* cited by examiner

| Number | a/b | Size of crucible/mm | Retention rate | Retention amount/kg | Furnace pressure /Torr | Flow rate of argon/lmp | Height of heating element mm | Oxygen content/ppma |
|---|---|---|---|---|---|---|---|---|
| Control Group 1 | 2. 9 | 630 | 28% | 250 | 11 | 90 | 800 | 15. 24 |
| Control Group 2 | 2. 3 | 600 | 28% | 250 | 12 | 90 | 800 | 14. 88 |
| Experimental Group 1 | 3. 7 | 800 | 40% | 340 | 8 | 101 | 950 | 11. 28 |
| Experimental Group 2 | 3. 2 | 750 | 40% | 340 | 8 | 101 | 950 | 12. 24 |
| Experimental Group 3 | 3. 0 | 730 | 40% | 340 | 8 | 110 | 950 | 11. 76 |
| Experimental Group 4 | 3. 9 | 730 | 40% | 340 | 8 | 110 | 950 | 10. 92 |

Fig. 3

MANUFACTURING METHOD FOR SINGLE-CRYSTAL SILICON ROD AND SINGLE-CRYSTAL FURNACE

CROSS-REFERENCE TO RELATED APPLICATIONS

The present application claims priorities to Chinese Patent Application No. 202311278960.X, filed on Sep. 28, 2023; Chinese Patent Application No. 202322663362.6, filed on Sep. 28, 2023; Chinese Patent Application No. 202322663792.8, filed on Sep. 28, 2023 the content of which are incorporated herein by reference in its entirety.

TECHNICAL FIELD

The present disclosure relates to the technical field of single-crystal silicon, and in particular, to a manufacturing method for a single-crystal silicon rod and a single-crystal furnace.

BACKGROUND

With the development of technologies, solar equipment is used more and more widely. Manufacturing a single-crystal silicon rod through a single-crystal furnace is an important machining step for the solar equipment. However, during the machining of the single-crystal silicon rod, the single-crystal silicon rod is prone to contact with oxygen transported by a crucible, causing oxygen content in the single-crystal silicon rod to increase and affecting the quality of the single-crystal silicon rod.

SUMMARY

In view of this, the present disclosure provides a manufacturing method for a single-crystal silicon rod and a single-crystal furnace, to improve the quality of the single-crystal silicon rod.

The present disclosure provides a manufacturing method for a single-crystal silicon rod, wherein the single-crystal silicon rod is pulled through a single-crystal furnace, a crucible of the single-crystal furnace has a depth ranging from 680 mm to 800 mm, and the manufacturing method for a single-crystal silicon rod includes:

initially charging a silicon material to the crucible, wherein a contact area between the silicon material in the crucible and the crucible is a, a contact area between a liquid level of the silicon material in the crucible and the outside is b, and $3.0 \leq a/b \leq 3.9$.

In some embodiments, during the crystal pulling, when a/b satisfies $1.2 \leq a/b \leq 1.5$, the crucible is fed.

In some embodiments, after the crystal pulling, the silicon material has a retention rate of 30% to 40%, and/or after a single crystal pulling, a retention amount of the silicon material ranges from 300 kg to 410 kg.

In some embodiments, when the silicon material is initially fed into the crucible, a layer of the silicon material with a linear width of 20 mm to 70 mm is first fed, the silicon material with a linear width of 70 mm to 210 mm is then fed, and the silicon material with the linear width of 20 mm to 70 mm is fed between the silicon material of 70 mm and 210 mm and an inner wall of the crucible.

In some embodiments, when the silicon material is initially fed into the crucible, a layer of 40 kg to 90 kg of the silicon material with a linear width of 20 mm to 70 mm is first fed, 40 kg to 210 kg of the silicon material with a linear width of 70 mm to 210 mm is then fed, and the silicon material with the linear width of 20 mm to 70 mm is fed between the silicon material of 70 mm and 210 mm and the inner wall of the crucible;

the above steps are repeated until the initial charging is completed.

In some embodiments, when the steps of first charging a layer of 40 kg to 90 kg of the silicon material with a linear width of 20 mm to 70 mm, then charging 40 kg to 210 kg of the silicon material with a linear width of 70 mm to 210 mm, and charging the silicon material with the linear width of 20 mm to 70 mm between the silicon material of 70 mm and 210 mm and the inner wall of the crucible are repeated, mass of the silicon material with the linear width of 70 mm to 210 mm charged each time gradually decreases.

In some embodiments, when the silicon material is initially charged into the crucible, charging is performed three times, mass of the silicon material with the linear width of 70 mm to 210 mm charged in the first charging is 140 kg to 200 kg, mass of the silicon material with the linear width of 70 mm to 210 mm charged in the second charging is 100 kg to 150 kg, and mass of the silicon material with the linear width of 70 mm to 210 mm charged in the third charging is 50 kg to 100 kg.

In some embodiments, when the steps of first charging a layer of 40 kg to 90 kg of the silicon material with a linear width of 20 mm to 70 mm, then charging 40 kg to 210 kg of the silicon material with a linear width of 70 mm to 210 mm, and charging the silicon material with the linear width of 20 mm to 70 mm between the silicon material of 70 mm and 210 mm and the inner wall of the crucible are repeated, the linear width of the silicon material with the linear width of 70 mm to 210 mm charged each time gradually decreases.

In some embodiments, when the silicon material is initially charged into the crucible, charging is performed three times, the silicon material of 70 mm and 210 mm in the first charging is blocks with a linear width of 70 mm to 210 mm, the silicon material of 70 mm and 210 mm in the second charging is blocks with a linear width of 70 mm to 150 mm, and the silicon material of 70 mm and 210 mm in the third charging is blocks with a linear width of 70 mm to 130 mm.

In some embodiments, mass of the silicon material with the linear width of 70 mm to 210 mm fed each time gradually decreases.

In some embodiments, the silicon material with the linear width of 20 mm to 70 mm accounts for 27% to 35% of a total amount of the silicon material initially fed.

In some embodiments, the manufacturing method includes:

melting the silicon material in the crucible, and when the linear width of the silicon material is less than 150 mm, adjusting the single-crystal furnace to a negative pressure state and introducing argon into the single-crystal furnace.

In some embodiments, during the manufacturing, when the linear width of the silicon material is less than 150 mm, furnace pressure of the single-crystal furnace is adjusted to 4 Torr to 8 Torr.

In some embodiments, during the manufacturing, when the linear width of the silicon material is less than 150 mm, a flow rate of the argon introduced is c, and $100\ \text{lmp} < c \leq 150\ \text{lmp}$.

In some embodiments, the single-crystal furnace includes a heating element and a crucible holder configured to place the crucible, and after the silicon material is fed into the crucible, a contact area between the silicon material in the crucible and the crucible is a, a contact area between a liquid level of the silicon material in the crucible and a gas is b, and 1.2≤a/b≤3.7, the manufacturing method includes:

making an upper edge of the crucible holder higher than an upper edge of the heating element and a distance between the upper edge of the crucible holder and the upper edge of the heating element no more than 200 mm;

moving the crucible into the single-crystal furnace; and lifting the crucible holder until the crucible holder abuts against the crucible.

In some embodiments, the step of moving the crucible into the single-crystal furnace includes:

extending an upper edge of the crucible into an upper edge of a first insulation member of the single-crystal furnace by 50 mm to 130 mm.

The present disclosure further provides a single-crystal furnace, wherein the single-crystal furnace includes a crucible, and the crucible has a depth ranging from 680 mm to 800 mm;

the single-crystal furnace includes a main body portion and a bottom plate assembly, wherein the main body portion is installed on the bottom plate assembly; and the main body portion has an accommodating cavity, and the crucible is located in the accommodating cavity; and along a height direction of the single-crystal furnace, the main body portion includes a first main body portion, a second main body portion, and a spacer, wherein the first main body portion is located on a side of the main body portion close to the bottom plate assembly, the second main body portion is located on a side of the first main body portion away from the bottom plate assembly, and the spacer is located between the first main body portion and the second main body portion.

In some embodiments, the single-crystal furnace includes a crucible holder, the crucible holder is configured to place the crucible, and the crucible holder and/or the crucible are/is capable of moving along the height direction of the single-crystal furnace relative to the bottom plate assembly.

In some embodiments, the crucible holder is capable of moving along the height direction of the single-crystal furnace relative to the bottom plate assembly, and along the height direction of the single-crystal furnace, the crucible holder is positioned 200 mm below an upper edge of a heating element.

In some embodiments, the single-crystal furnace includes a heating element, and along the height direction of the single-crystal furnace, the heating element has a size of 850 mm to 970 mm.

Some embodiments of the present disclosure provide a manufacturing method for a single-crystal silicon rod and a single-crystal furnace. The single-crystal silicon rod is pulled through a single-crystal furnace, and a crucible of the single-crystal furnace has a depth ranging from 680 mm to 800 mm. The manufacturing method for a single-crystal silicon rod includes: initially charging a silicon material to the crucible, wherein a contact area between the silicon material in the crucible and the crucible is a, a contact area between a liquid level of the silicon material in the crucible and the outside is b, and 1.2≤a/b≤3.7. In this way, a feeding amount of the crucible can be increased, so that the head of the single-crystal silicon rod receives as little oxygen as possible from the bottom of the crucible, thereby reducing oxygen content in the head of the single-crystal silicon rod, which is conducive to improving the quality of the single-crystal silicon rod and is more in line with an actual use requirement.

It should be understood that the general description above and the detailed description in the following are merely exemplary and illustrative, and cannot limit the present disclosure.

BRIEF DESCRIPTION OF DRAWINGS

In order to more clearly illustrate the technical solutions in some embodiments of the present disclosure, the accompanying drawings used in the description of the embodiments will be briefly introduced below. It is apparent that the accompanying drawings in the following description are only some embodiments of the present disclosure, and other accompanying drawings can be obtained by those of ordinary skill in the art from the provided accompanying drawings without creative efforts.

FIG. 3 is a schematic diagram of manufacturing parameters of a single-crystal silicon rod according to the present disclosure.

REFERENCE SIGNS

Figure 1:
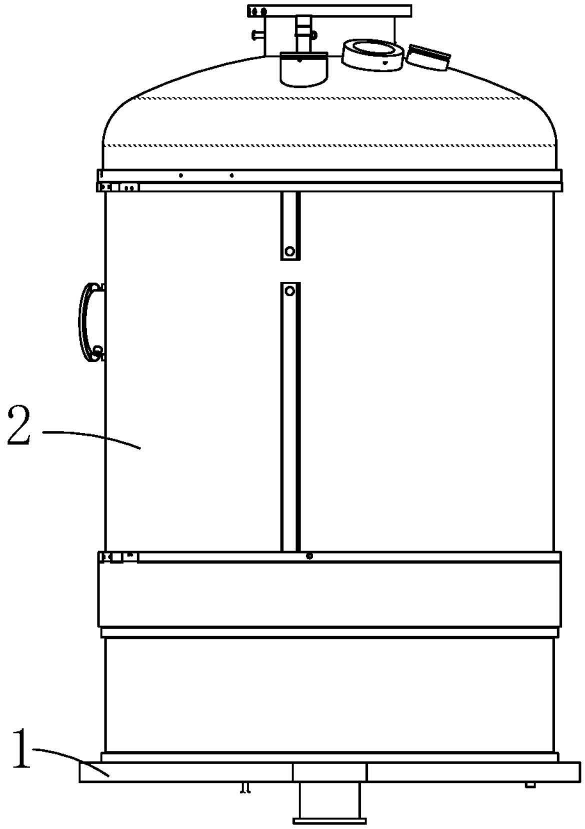
FIG. 1 is a schematic diagram of a single-crystal furnace according to the present disclosure.
Figure 2:
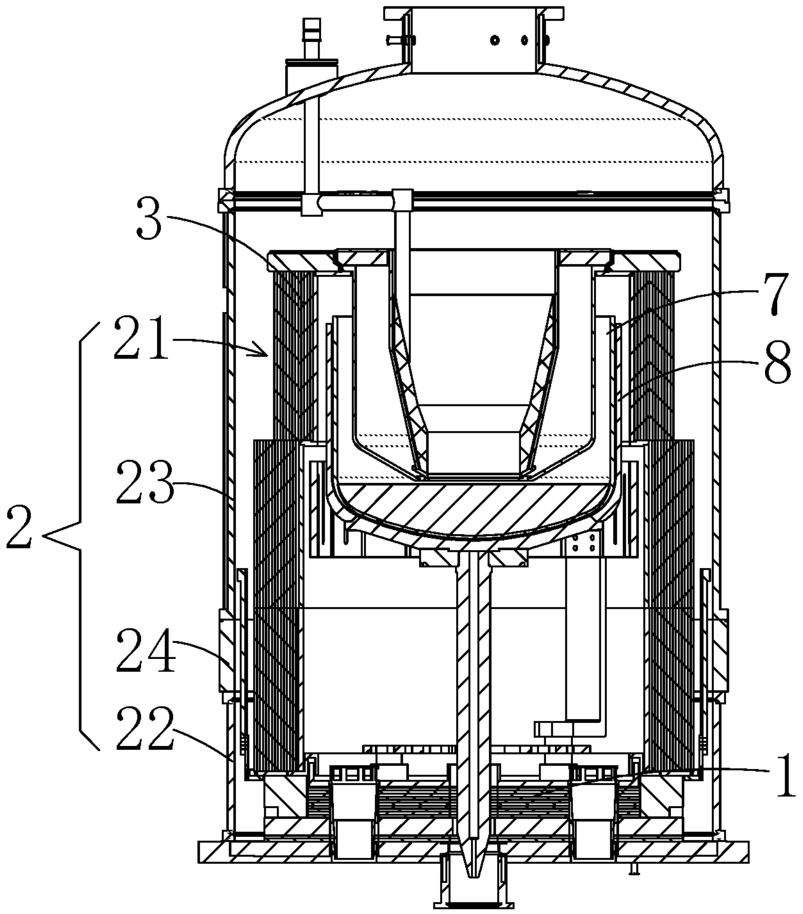
FIG. 2 is a sectional view of the single-crystal furnace according to the present disclosure.
Figure 4:
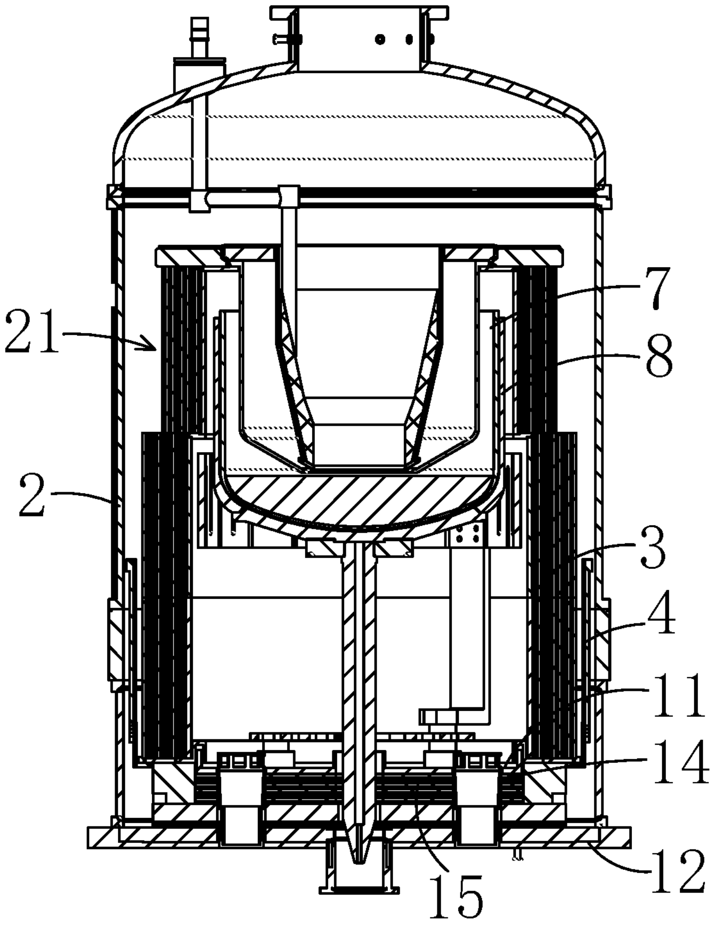
FIG. 4 is a sectional view of the single-crystal furnace according to the present disclosure.
Figure 5:
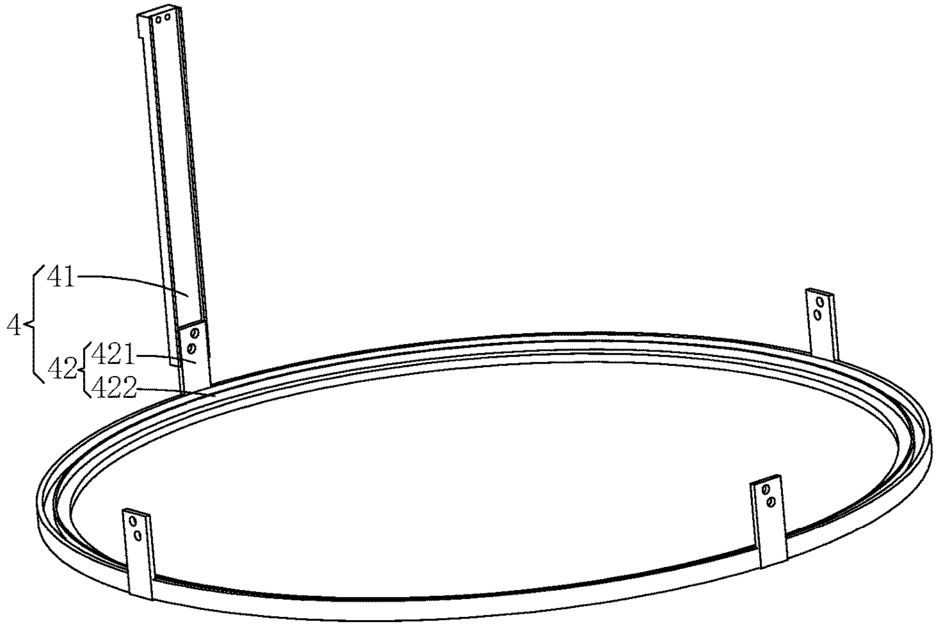
FIG. 5 is a schematic diagram of a lifting device according to the present disclosure.
Figure 6:
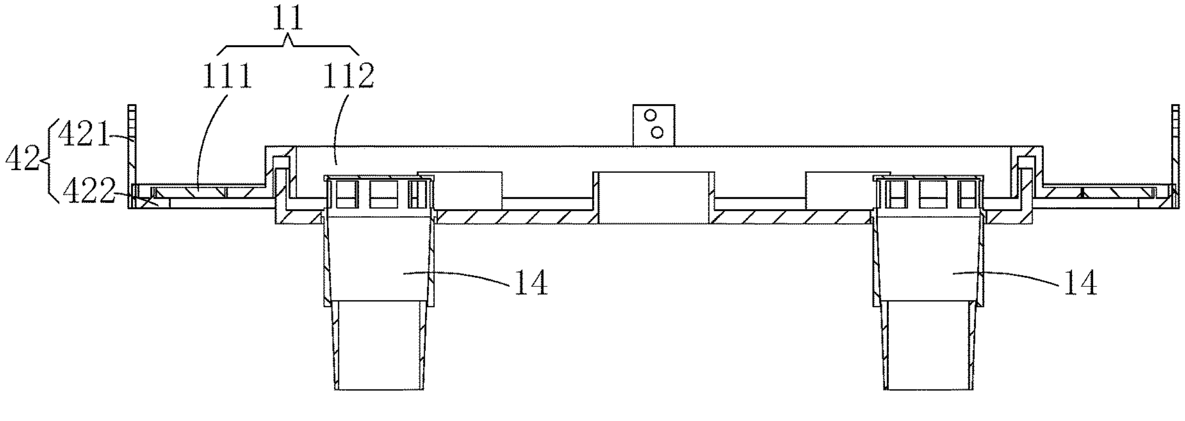
FIG. 6 is a schematic diagram of a protective plate and an air duct according to the present disclosure.

1: bottom plate assembly;
11: protective plate;
111: first body portion;
112: second body portion;
12: body plate;
13: installation hole;
131: first thread structure;
14: air duct;
141: first duct body;
142: second duct body;
143: second thread structure;
15: second insulation member;
2: main body portion;
21: accommodating cavity;
22: first main body portion;
23: second main body portion;
24: spacer;
3: first insulation member;
4: lifting device;
41: installation member;
42: connecting member;
421: first connecting portion;
422: second connecting portion;
5: heating element;
51: second connecting hole;

52: limiting slot;
6: foot plate;
61: first connecting section;
611: first connecting hole;
612: protruding portion;
62: body section;
63: second connecting section;
7: crucible;
8: crucible holder.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

In order to better understand the technical solutions of the present disclosure, some embodiments of the present disclosure will be described in detail below with reference to the accompanying drawings.

It should be clear that the described embodiments are only some of the embodiments rather than all of the embodiments of the present disclosure. Based on the embodiments in the present disclosure, all other embodiments obtained by those of ordinary skill in the art without creative efforts fall within the protection scope of the present disclosure.

The terms used in the embodiments of the present disclosure are merely for the purpose of describing specific embodiments and are not intended to limit the present disclosure. As used in the embodiments of the present disclosure and the appended claims, the singular forms of "a/an", "said", and "the" are also intended to include plural forms, unless otherwise clearly specified in the context.

It should be understood that the term "and/or" used herein describes an association relationship between associated objects and indicates that three relationships may exist. For example, A and/or B may indicate the following three cases: only A exists, both A and B exist, and only B exists. In addition, the character "/" herein generally indicates an "or" relationship between the associated objects.

Some embodiments of the present disclosure provide a manufacturing method for a single-crystal silicon rod. The single-crystal silicon rod is pulled through a single-crystal furnace, and the single-crystal furnace includes a crucible 7 with a depth ranging from 680 mm to 800 mm, and the depth doesn't include the thickness of the crucible. The manufacturing method for a single-crystal silicon rod includes: initially charging a silicon material to the crucible 7, wherein a contact area between the silicon material in the crucible 7 and the crucible 7 is a, and the silicon material is in a melt state; and a contact area between a liquid level of the silicon material in the crucible 7 and the outside is b, and the silicon material is in a melt state. The contact area between the liquid level of the silicon material in the crucible 7 and the outside is a contact area between the silicon material and an external atmosphere, which is approximately the same as an area of the liquid level of the silicon material. After the initial charging, a relationship between a and b satisfies $3.0 \le a/b \le 3.9$.

A ratio of a/b may be 3.0, 3.1, 3.2, 3.3, 3.4, 3.5, 3.6, 3.7, 3.8, 3.9, or the like.

Through such a design, the head of the single-crystal silicon rod can receive as little oxygen as possible from the bottom of the crucible 7. When oxygen content in the single-crystal silicon rod is high, the lifetime of minority carriers in the head of the single-crystal silicon rod may be shortened, which affects the quality of the single-crystal silicon rod. According to the method provided in some embodiments of the present disclosure, a size of the crucible 7 is adjusted, and the contact area between the silicon material in the crucible 7 and the crucible 7 and the contact area between the liquid level of the silicon material in the crucible 7 and the outside are reduced, which can reduce a possibility that the head of the single-crystal silicon rod receives oxygen from the bottom of the crucible 7, so as to reduce oxygen content in the head of the single-crystal silicon rod, thereby helping to improve the quality of the single-crystal silicon rod.

The depth of the crucible 7 provided in some embodiments of the present disclosure may be 680 mm, 690 mm, 700 mm, 710 mm, 720 mm, 730 mm, 740 mm, 750 mm, 760 mm, 770 mm, 780 mm, 790 mm, 800 mm, or the like. Compared with a conventional crucible 7, the depth of the crucible 7 provided in some embodiments of the present disclosure is increased by 50 mm to 170 mm, which can increase a feeding amount. Moreover, as the depth of the crucible 7 increases, a distance between the bottom of the crucible 7 and the head of the single-crystal silicon rod also increases relatively, and a distance of upward transportation of oxygen at the bottom of the crucible 7 also increases, which can reduce a possibility of contact of the head of the single-crystal silicon rod with the bottom of the crucible 7, thereby helping to reduce oxygen content in the single-crystal silicon rod, improving the quality of the single-crystal silicon rod, and being more in line with an actual use requirement.

In some embodiments, the manufacturing method for a single-crystal silicon rod includes: during the crystal pulling, when a/b satisfies $1.2 \le a/b \le 1.5$, the crucible 7 is fed with the silicon material, and further feeding the silicon material is performed after pulling a single-crystal silicon rod has been accomplished.

During the crystal pulling, as the crystal pulling proceeds, the silicon material in the crucible 7 gradually decreases, so there is a need to re-charge the crucible 7 to meet a requirement of crystal pulling for the silicon material. At the same time, as the silicon material in the crucible 7 decreases, the contact area between the silicon material in the crucible 7 and the crucible 7 also gradually decreases. The contact area between the silicon material in the crucible 7 and the crucible 7 changes relatively obviously, while the contact area between the liquid level of the silicon material in the crucible 7 and the outside changes little. Therefore, during the crystal pulling, the ratio of a/b gradually decreases. When $1.2 \le a/b \le 1.5$, the crucible 7 is fed to meet a requirement for continuous crystal pulling. When the ratio of a/b is excessively small and re-charging is performed, an amount of the remaining silicon material in the crucible 7 is small, and impurities in the silicon material can easily enter the single-crystal silicon rod during the crystal pulling, affecting the quality of the single-crystal silicon rod. When the ratio of a/b is excessively large and re-charging is performed, it is easy to cause the silicon material to overflow from the crucible 7 to corrode a bottom plate assembly 1 of the single-crystal furnace, which affects the service life of the single-crystal furnace. The charging performed when $1.2a/b \le 1.5$ causes more impurities to precipitate in the crucible 7 without entering the single-crystal silicon rod. At the same time, the possibility of overflowing of the silicon material from the crucible 7 during the crystal pulling can also be reduced, which is more in line with an actual use requirement.

During the crystal pulling, a/b is kept to be no less than 1.2, which helps to increase a length of the single-crystal silicon rod and can also reduce impurity content at a tail end of the single-crystal silicon rod, thereby helping to improve the quality of the silicon rod.

In some embodiments, after the crystal pulling, the silicon material has a retention rate of 30% to 40%, and/or a retention amount of the silicon material ranges from 300 kg to 410 kg.

The retention rate of the silicon material is a ratio of an amount of the silicon material remaining in the crucible 7 to a full amount in the crucible 7 after completion of the crystal pulling.

The retention rate of the silicon material may be 30%, 31%, 32%, 33, 34%, 35%, 36%, 37%, 38%, 39%, 40%, or the like. The retention amount of the silicon material may be 300 kg, 310 kg, 320 kg, 330 kg, 340 kg, 350 kg, 360 kg, 370 kg, 380 kg, 390 kg, 400 kg, 410 kg, or the like.

Compared with an existing crystal pulling solution, the retention rate and the retention amount in the solution provided in some embodiments of the present disclosure are relatively large. By increasing the retention rate and the retention amount, an amount of the remaining material in crucible 7 can be increased. Since there are relatively more materials remaining in the crucible 7, there are also relatively more impurities precipitating in the crucible 7, which can reduce a possibility of entry of the impurities into the single-crystal silicon rod, thereby helping to improve the quality of the single-crystal silicon rod and being more in line with actual manufacturing and use requirements.

In some embodiments, when the silicon material is initially fed into the crucible 7, a layer of the silicon material that is smaller and has a linear width of 20 mm to 70 mm may be first put into the crucible, and the silicon material that is larger and has a linear width of 70 mm to 210 mm is then put into the crucible. The silicon material with the linear width of 70 mm to 210 mm is placed relatively centrally, and part of the silicon material with the linear width of 20 mm to 70 mm is fed between the silicon material of 70 mm to 210 mm and an inner wall of the crucible 7. That is, the silicon material with a smaller size is located outside the silicon material with a larger size.

The linear width of the silicon material that is smaller may be 20 mm, 25 mm, 30 mm, 35 mm, 40 mm, 45 mm, 50 mm, 55 mm, 60 mm, 65 mm, 70 mm, or the like. The linear width of the silicon material that is larger may be 70 mm, 80 mm, 90 mm, 100 mm, 110 mm, 120 mm, 130 mm, 140 mm, 150 mm, 160 mm, 170 mm, 180 mm, 190 mm, 200 mm, 210 mm, or the like.

During the melting, the silicon material close to the inner wall of the crucible 7 is heated faster, and heat is transferred relatively slowly to the interior of the crucible. Therefore, during the melting, the silicon material that has just entered the crucible 7 melts quickly. The silicon material located at the center of the bottom is more easily heated. When the silicon material at the bottom melts quickly, a certain space is easily formed after the melting. When the silicon material with the larger size is directly placed at the bottom of the crucible 7, since the silicon material in the middle melts faster, after the silicon material with the larger size melts, the bottom of the silicon material in the crucible 7 is relatively empty, and it is easy to cause material collapse.

Therefore, in the manufacturing method for a single-crystal silicon rod provided in some embodiments of the present disclosure, the problem of easy material collapse during the crystal pulling is solved by first charging the silicon material with the smaller size into the bottom of the crucible 7. Since the size of the material at the bottom is smaller, after the silicon material at the bottom melts, a space at the bottom is relatively small. However, the size of the silicon material at the top is relatively large, and the remaining space is insufficient to cause the silicon material with the larger size to fall, so a possibility of material collapse can be reduced.

In some embodiments, when the silicon material is initially fed into the crucible 7, a layer of 40 kg to 90 kg of the silicon material with a linear width of 20 mm to 70 mm is first fed, 40 kg to 210 kg of the silicon material with a linear width of 70 mm to 210 mm is then fed, and the silicon material with the linear width of 20 mm to 70 mm is fed between the silicon material of 70 mm and 210 mm and the inner wall of the crucible 7. The above steps are repeated until the initial charging is completed.

Mass of the fed silicon material with the linear width of 70 mm to 210 mm may be 40 kg, 45 kg, 50 kg, 55 kg, 60 kg, 65 kg, 70 kg, 75 kg, 80 kg, 85 kg, 90 kg, or the like. Mass of the fed silicon material with a linear width of 190 mm to 210 mm may be 40 kg, 50 kg, 60 kg, 70 kg, 80 kg, 90 kg, 100 kg, 110 kg, 120 kg, 130 kg, 140 kg, 150 kg, 160 kg, 170 kg, 180 kg, 190 kg, 200 kg, 210 kg, or the like.

In this way, the material can be distributed in the crucible 7 more reasonably, and a space between the silicon material with the larger size and the inner wall of the crucible 7 is filled with the silicon material with the smaller size. During the melting, the silicon material close to the crucible 7 melts first. That is, the silicon material with the smaller size melts first. Since the size of the melting silicon material is smaller, a space vacated after the melting is also relatively small, which can reduce a possibility of material collapse.

In some embodiments, the initial charging may be divided into multiple times. A certain amount of the silicon material with a linear width of 20 mm to 70 mm and a certain amount of the silicon material with a linear width of 70 mm to 210 mm are fed each time. In this charging manner, the silicon material can be distributed more evenly in the crucible 7, and the structure can be more reasonable, thereby reducing a possibility of material collapse and the like and helping to improve the quality of machining.

In some embodiments, mass of the silicon material with the linear width of 70 mm to 210 mm fed each time gradually decreases.

The silicon material with the linear width of 20 nm to 70 nm may generally be made smaller, and the silicon material with the linear width of 70 mm to 210 mm may generally be made into blocks.

For example, the initial charging is divided into three times. In the first charging, mass of the fed silicon material (blocks) with the linear width of 70 mm to 210 mm may be 140 kg to 200 kg. In the second charging, mass of the fed silicon material (blocks) with the linear width of 70 mm to 210 mm may be 100 kg to 150 kg. In the third charging, mass of the fed silicon material (blocks) with the linear width of 70 mm to 210 mm may be 50 kg to 100 kg.

In some embodiments, the blocks fed in the first charging may be the silicon material with the linear width of 70 mm to 210 mm, the blocks fed in the second charging may be the silicon material with the linear width of 70 mm to 150 mm, and the blocks fed in the third charging may be the silicon material with the linear width of 70 mm to 130 mm. That is, linear widths of the larger blocks fed gradually decrease.

When the blocks located below are smaller in size and the blocks located above are larger in size, after the blocks below melt, the blocks above fall. The blocks above are larger in size and therefore have relatively great mass. When falling, the blocks have a larger impact on the bottom of the crucible 7, which can easily cause damages to the crucible 7. When the blocks located below are larger in size and the blocks located above are smaller in size, the silicon material with a larger linear width melts relatively slowly during the melting, which can reduce a possibility of material collapse caused by quick melting of the silicon material near the bottom. Moreover, along a direction away from the bottom of the crucible 7, the size of the blocks gradually decreases, and the mass of the blocks is also relatively small. When the blocks at the bottom melt and the blocks located above fall, there is a small impact on the bottom of the crucible 7, which can reduce a possibility of damages to the crucible 7 and help to prolong the service life of the crucible 7.

In this way, it is conducive to reasonably distributing the space of the silicon material in the crucible 7 and reducing a possibility of material collapse, thereby helping to improve the quality of the single-crystal silicon rod and being more in line with an actual manufacturing requirement.

In some embodiments, in the initial charging, the silicon material with the linear width of 20 mm to 70 mm accounts for 27% to 35% of total mass of the initial charging.

A percentage of the silicon material with the linear width of 20 mm to 70 mm in the total mass of the initial charging may be 27%, 28%, 29%, 30%, 31%, 32%, 33%, 34%, 35%, or the like. Through such a design, proportions of the silicon material in different sizes can be relatively reasonable, so that the space of the crucible 7 can be fully utilized to accommodate more materials.

In some embodiments, the silicon material in the crucible 7 is melted, and when the linear width of the silicon material in the crucible 7 is less than 150 mm, the single-crystal furnace is adjusted to a negative pressure state and argon is introduced.

Through the adjustment of the pressure in the single-crystal furnace, saturated vapor pressure of silicon vapor in the furnace can be increased to evaporate oxygen. Through the introduction of the argon, volatile oxygen and impurities can be taken away by using flow of the argon, thereby reducing the impact of oxygen and other impurities on the single-crystal silicon rod caused by shear convection.

In some embodiments, the manufacturing method for a single-crystal silicon rod provided in some embodiments of the present disclosure includes, during the melting, when the linear width of the silicon material melts to less than 150 mm, adjusting pressure of the single-crystal furnace to 4 Torr to 8 Torr.

When the silicon material melts to less than 150 mm, the pressure of the single-crystal furnace may be adjusted to 4 Torr, 5 Torr, 6 Torr, 7 Torr, 8 Torr, or the like.

Generally, furnace pressure of the single-crystal furnace ranges from 10 Torr to 13 Torr. In the manufacturing method for a single-crystal silicon rod provided in some embodiments of the present disclosure, the pressure of the single-crystal furnace ranges from 4 Torr to 8 Torr. One standard atmospheric pressure is 760 Torr. Therefore, compared with the conventional solution, pressure inside the single-crystal furnace under negative pressure is increased. Therefore, volatilization of oxygen on a contact surface between the liquid level of the silicon material and the outside can be increased, thereby reducing the impact of the oxygen on the silicon rod caused by shear convection. Then, it is conducive to improving the quality of the single-crystal silicon rod.

In some embodiments, when the linear width of the silicon material is less than 150 mm, a flow rate of the argon introduced is c, and 100 lmp$<c\leq$150 lmp.

The flow rate of the argon may be 101 lmp, 105 lmp, 110 lmp, 115 lmp, 120 lmp, 125 lmp, 130 lmp, 135 lmp, 140 lmp, 145 lmp, 150 lmp, or the like.

Generally, the flow rate of the argon introduced into the single-crystal furnace ranges from 80 lmp to 100 lmp. In the solution provided in some embodiments of the present disclosure, the flow rate of the argon is increased. Therefore, it is more conducive to taking away volatilized impurities in a timely manner through the flow of the argon, which is conducive to improving the quality of the single-crystal silicon rod and more in line with an actual manufacturing requirement.

In some embodiments, the single-crystal furnace includes a heating element 5 and a crucible holder 8. The crucible holder 8 is configured to place the crucible 7. When the single-crystal silicon rod is manufactured, initial charging is first performed on the crucible 7, and then the crucible 7 is put into the single-crystal furnace. The crucible holder 8 is placed at a position not exceeding 200 mm from an upper edge of the heating element 5. That is, an upper edge of the crucible holder 8 is located at a position no more than 200 mm above the upper edge of the heating element 5. The crucible 7 is moved into the single-crystal furnace, and then the crucible holder 8 is lifted to cause the crucible holder 8 to abut against the crucible 7.

Generally, when the crucible 7 is moved, an apparatus for transporting the crucible 7, such as a landing frame, moves quickly. When the crucible 7 is directly placed into the crucible holder 8, the impact on the bottom of the crucible 7 is greater, which may easily lead to cracks in the crucible 7 and cause damages to the crucible 7, thereby affecting the service life of the crucible 7. However, in the solution provided in some embodiments of the present disclosure, the crucible holder 8 and the crucible 7 are placed at the preset positions respectively, and then the crucible holder 8 is lifted to place the crucible 7 on the crucible holder 8. Since the apparatus that moves the crucible holder 8 moves relatively slowly, placing the crucible 7 in this way can mitigate the impact on the crucible 7 when the crucible 7 and the crucible holder 8 come into contact, thereby reducing a possibility of cracks in the crucible 7, which helps to prolong the service life of the crucible 7 and is more in line with an actual use requirement.

In some embodiments, when the crucible 7 is moved into the single-crystal furnace, the crucible 7 is moved until an upper edge of the crucible 7 extends into a first insulation member of the single-crystal furnace by 350 mm to 130 mm. The first insulation member is an insulation barrel of the single-crystal furnace, and the bottom plate assembly of the single-crystal furnace is provided with a second insulation member.

The upper edge of the crucible 7 may extend into the upper edge of the single-crystal furnace by 50 mm, 60 mm, 70 mm, 80 mm, 90 mm, 100 mm, 110 mm, 120 mm, 130 mm, or the like.

Through such a design, the crucible holder 8 and the crucible 7 can be placed at preset positions respectively, and then the crucible holder 8 can be moved, thereby reducing a possibility of damages to the crucible 7 due to the impact between the crucible holder 8 and the crucible 7.

By use of the method provided in some embodiments of the present disclosure, it is conducive to improving the quality of the single-crystal silicon rod, cell efficiency is increased by about 0.02%, and yield per unit is increased by 6 kg/d to 10 kg/d.

As shown in the figure, some embodiments of the present disclosure further provide a single-crystal furnace. The single-crystal furnace may be pulled through the manufacturing method for a single-crystal silicon rod involved in any one of the above embodiments, so as to manufacture the single-crystal silicon rod. The single-crystal furnace includes a crucible 7, a main body portion 2, and a bottom plate assembly 1. The main body portion 2 is installed on the bottom plate assembly 1. The main body portion 2 has an accommodating cavity 21. The crucible 7 is located in the accommodating cavity 21. The crucible 7 has a depth ranging from 680 mm to 800 mm. Along a height direction of the single-crystal furnace, the main body portion 2 includes a first main body portion 22, a second main body portion 23, and a spacer 24. The first main body portion 22 is located on a side of the main body portion 2 close to the bottom plate assembly 1, the second main body portion 23 is located on a side of the first main body portion 22 away from the bottom plate assembly 1, and the spacer 24 is located between the first main body portion 22 and the second main body portion 23.

Compared with a conventional single-crystal furnace, in the solution provided in some embodiments of the present disclosure, the size of the crucible 7 is increased, and the depth of the crucible 7 is increased by 50 mm to 170 mm. Since the size of the crucible 7 is increased, the size of the main body portion 2 can be increased by providing the spacer 24 between the first main body portion 22 and the second main body portion 23 so that the accommodating cavity 21 of the main body portion 2 has a sufficient space to accommodate the crucible 7. In the solution provided in some embodiments of the present disclosure, a feeding amount of the crucible 7 can be increased by increasing the size of the crucible 7, which helps to increase the value of a/b, extends a distance of upward transportation of oxygen at the bottom of the crucible 7, and can reduce oxygen received by the head of the single-crystal silicon rod, thereby reducing oxygen content in the single-crystal silicon rod and helping to increase yield per unit and improve the quality of the single-crystal silicon rod.

In some embodiments, the crucible holder 8 may move relative to the bottom plate assembly 1.

Through such a design, when the crucible 7 is placed, the crucible holder 8 may be moved to come into contact with the crucible 7. Since the crucible holder 8 moves more slowly than the crucible 7, the impact of the crucible holder 8 on the crucible 7 can be mitigated, which is conducive to reducing a possibility of cracks in the crucible 7. Moreover, through segmented displacement, a stroke of each displacement can be shortened, thereby further reducing the impact when the crucible 7 and the crucible holder 8 come into contact, which is more in line with an actual use requirement.

During the crystal pulling, initial charging is performed on the crucible 7, and the crucible 7 is transported to the single-crystal furnace. The silicon material in the crucible 7 is melted by using the heating element 5 in the furnace, and a seed crystal fixed to a seed shaft is inserted into a surface of a melt. After the seed crystal and the melt are fully fused, the seed crystal is slowly pulled upward, and the crystal may grow at a lower end of the seed crystal.

During the charging, polysilicon raw materials are doped and put into the crucible 7. The charging manner may be obtained with reference to the manner mentioned above. The silicon material with a larger linear width is located in the middle, and the silicon material with a smaller linear width is located around. After passing leak detection, the silicon material is melted through the heating element 5. Moreover, during the melting of the silicon material, the pressure in the single-crystal furnace is adjusted to a negative pressure state and argon is introduced at the same time. Seeding may be performed after completion of the melting. After a temperature of a molten surface of the silicon material is stabilized, a thin neck is extracted by using the seed crystal (seed). After the seeding, shoulder expanding/shoulder turning is performed. After completion of the seeding process, a temperature and a crystal pulling speed are appropriately reduced to control quality, a speed, and a shape of the shoulder expanding, so that the crystal can be enlarged to a target diameter. After being shoulder-expanded to the target diameter, a diameter of the crystal is controlled within a target diameter range by controlling the pulling speed and the temperature, which is an equal diameter step. In the equal diameter step, as the crystal pulling proceeds, a position of the crucible 7 may gradually rise. After completion of equal-diameter growth, a process of slowly reducing a diameter of the crystal rod to a sharp point and then separating the crystal rod from a silicon solution is an ending step.

Prior to the equal diameter step, the upper edge of the crucible 7 is located 90 mm to 100 mm below the upper edge of the heating element 5. From the equal diameter process until completion of crystal pulling of a single silicon rod, the position of the crucible 7 gradually rises. Generally, to pull a single single-crystal silicon rod, the crucible 7 rises by 290 mm to 330 mm, and after the pulling of the single single-crystal silicon rod, the upper edge of the crucible 7 drops again to a position of 90 mm to 100 mm from the upper edge of the heating element 5. Moreover, the above steps are repeated during the crystal pulling. After completion of pulling of the last single-crystal silicon rod, the crucible 7 rises by 680 mm. During the rising of the crucible 7, a rising speed is 4 mm/h to 10 mm/h.

As shown in FIG. 3, in data shown in FIG. 3, Control Group 1 and Control Group 2 are conventional technical solutions, and Experimental Group 1, Experimental Group 2, Experimental Group 3, and Experimental Group 4 are technical solutions provided in some embodiments of the present disclosure. The size of the crucible 7 is the depth of the crucible 7, and radial dimensions of the crucible 7 in respective control groups and experimental groups are the same.

PPMA means parts per million (atomic) by mass. By comparing the control groups with the experimental groups, it may be clearly obtained that, compared with the conventional solution, the oxygen content in the single-crystal silicon rod can be significantly reduced by use of the technical solution provided in some embodiments of the present disclosure. According to some embodiments of the present disclosure, a volume of the crucible 7 can be increased by increasing the depth of the crucible 7, thereby increasing the ratio of a/b, which helps to reduce the oxygen content in the single-crystal silicon rod. At the same time, in some embodiments of the present disclosure, furnace pressure and a flow rate of argon are adjusted. Through the adjustment of the furnace pressure, pressure on the silicon material in the single-crystal furnace can be increased to facilitate volatilization of impurities. Increasing the flow rate of the argon can promptly utilize the flow of the argon to take away volatilized impurities, thereby helping to improve the quality of the single-crystal silicon rod. At the same time, in some embodiments of the present disclosure, the retention rate is also increased. Increasing the retention rate enables more non-volatilized impurities to precipitate in the crucible, thereby reducing the impurities in the single-crystal silicon rod. When the retention rate is low, impurities in the silicon material can easily enter the single-crystal silicon rod along with the silicon material, resulting in poor quality of the single-crystal silicon rod. Adjusting a height of the heating element can improve heating efficiency, which is more in line with an actual use requirement.

By comparing the control groups with the experimental groups, it can be concluded that, by use of process data provided in some embodiments of the present disclosure, the oxygen content in the single-crystal silicon rod can be effectively reduced, thereby helping to improve product quality of the single-crystal silicon rod. By comparing Experimental Group 2 with Experimental Group 4, it can be concluded that, under a condition that the size of the crucible 7, the retention rate, the retention amount, the furnace pressure, the flow rate of the argon, and the height of the heating element are definite, the greater the value of a/b, the lower the oxygen content in the machined single-crystal silicon rod. By comparing Experimental Group 2 with Experimental Group 3, it can be concluded that, under a condition that the retention rate, the retention amount, and the height of the heating element are definite, increasing the flow rate of the argon has a more obvious effect on reducing the oxygen content in the single-crystal silicon rod than increasing the ratio of a/b in the initial charging. Therefore, in actual machining, the ratio of a/b of the initial charging and the flow rate of the argon can be increased at the same time to further reduce the oxygen content in the single-crystal silicon rod. By comparing Experimental Group 1 with Experimental Group 2, it can be concluded that, under a condition that the retention rate, the retention amount, the furnace pressure, and the flow rate of the argon are definite, increasing the size of the crucible 7 helps to increase the ratio of a/b of the initial charging and helps to reduce the oxygen content in the single-crystal silicon rod.

Some embodiments of the present disclosure provide a manufacturing method for a single-crystal silicon rod and a single-crystal furnace. The single-crystal silicon rod is pulled through a single-crystal furnace, and a crucible 7 of the single-crystal furnace has a depth ranging from 680 mm to 800 mm. The manufacturing method for a single-crystal silicon rod includes: initially charging a silicon material to the crucible 7, wherein a contact area between the silicon material in the crucible 7 and the crucible 7 is a, a contact area between a liquid level of the silicon material in the crucible 7 and the outside is b, and $1.25 \leq a/b \leq 3.7$. In this way, a feeding amount of the crucible 7 can be increased, so that the head of the single-crystal silicon rod receives as little oxygen as possible from the bottom of the crucible 7, thereby reducing oxygen content in the head of the single-crystal silicon rod. The lifetime of minority carriers in the head of the single-crystal silicon rod may be shortened due to an increase in the oxygen content. Therefore, a reduction in the oxygen content in the single-crystal silicon rod helps to improve the quality of the single-crystal silicon rod and is more in line with an actual use requirement.

Figure 7:
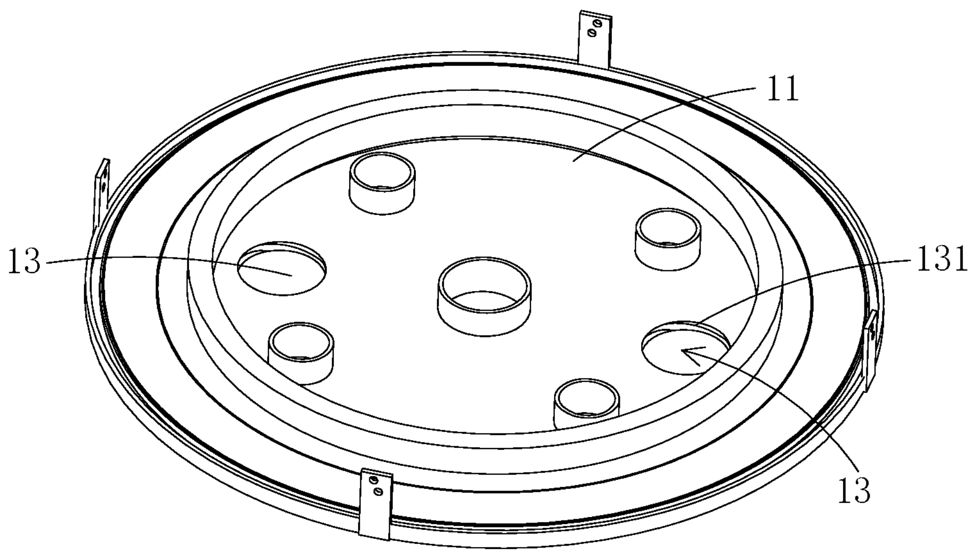
FIG. 7 is a schematic diagram of the protective plate according to the present disclosure.
Figure 8:
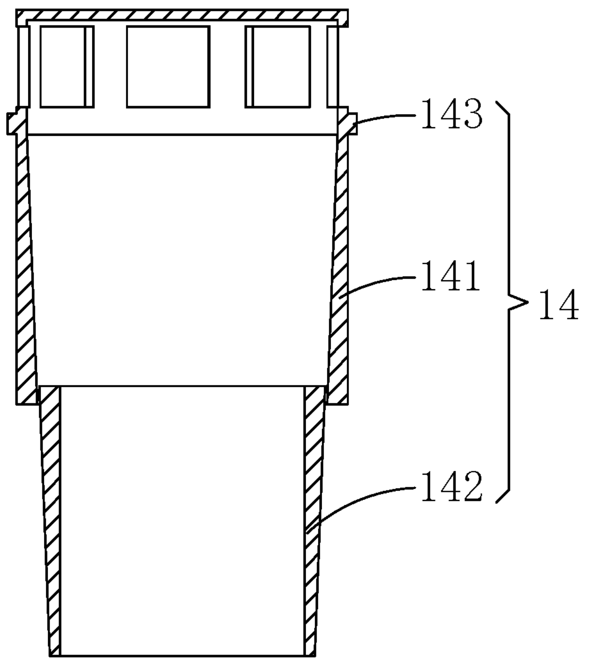
FIG. 8 is a schematic diagram of the air duct according to the present disclosure.

As shown in FIG. 1, FIG. 8, and FIG. 7, some embodiments of the present disclosure provide a single-crystal furnace. The single-crystal furnace may include bottom plate assembly 1, a main body portion 2, a first insulation member 3, and a lifting device 4. The main body portion 2 is installed on the bottom plate assembly 1. The main body portion 2 has an accommodating cavity 21. The first insulation member 3 is located in the accommodating cavity 21. The main body portion 2 may be a furnace cylinder of the single-crystal furnace. The accommodating cavity 21 is configured to accommodate components of the single-crystal furnace, including a crucible 7 and a crucible holder 8. The lifting device 4 is installed on the main body portion 4.

The lifting device 4 includes an installation member 41 and a connecting member 42. The installation member 41 is installed on the main body portion 2 through a threaded connection. The connecting member 42 is installed on the installation member 41 and configured to be connected to the first insulation member 3. The first insulation member 3 and the connecting member 42 may be connected by a relatively fixed connection or abutment. The connecting member 42 may be directly connected to the first insulation member 3 or indirectly connected to the first insulation member 3 through another component. When the main body portion 2 moves relative to the bottom plate assembly 1, the main body portion 2 may drive, through the lifting device 4, the first insulation member 3 to move relative to the bottom plate assembly 1.

According to the solution provided in some embodiments of the present disclosure, through the installation of the lifting device 4 in the single-crystal furnace, the first insulation member 3 can be disassembled together with the main body portion 2, which is more convenient during disassembly and cleaning. Moreover, during installation of the first insulation member 3 and disassembly of the first insulation member 3, a relative position between the first insulation member 3 and the main body portion 2 is relatively fixed, so that position accuracy of the first insulation member 3 can be improved, and the impact of operations such as disassembly and cleaning on the position accuracy of the first insulation member 3 can be reduced, thereby helping to improve consistency between heats. The installation member 41 is installed on the main body portion 2 through the threaded connection (the threaded connection is more stable than clamping and hooking), which can reduce a possibility of shaking of the lifting device 4 relative to the main body portion 2 during the installation, thereby helping to improve installation accuracy of the first insulation member 3 and being more in line with the actual use requirement.

As shown in FIG. 8, in some embodiments, the bottom plate assembly 1 includes a protective plate 11 and a body plate 12. The protective plate 11 and the body plate 12 are arranged along the height direction of the single-crystal furnace, and the protective plate 11 is located above the body plate 12. The first insulation member 3 is located on a side of the protective plate 11 away from the body plate 12. That is, the first insulation member 3 is located above the protective plate 11 and abuts against the protective plate 11. The protective plate 11 includes a first body portion 111 and a second body portion 112. The first insulation member 3 is connected to the first body portion 111, and the connecting member 42 is also connected to the first body portion 111. When the connecting member 42 moves along the installation member 41, the connecting member 42 can drive the first body portion 111 and the first insulation member 3 to move, so that the first insulation member 3 can be away from or close to the body plate 12. The second body portion 112 is configured to shield the body plate 12 to protect the body plate 12.

The protective plate 11 may be made of a carbon-carbon composite material, carbon ceramic, or the like. In the single-crystal furnace provided in some embodiments of the present disclosure, the protective plate 11 can be provided to protect the body plate 12, thereby reducing a possibility of corrosion of solid felt, soft felt, and the like of the bottom plate assembly 1 by silicon vapor due to overflowing of silicon liquid from the crucible 7 and reducing a possibility of damages to the bottom plate assembly 1, which helps to prolong the service life of the bottom plate assembly 1.

In some embodiments, the first body portion 111 is annular, and the first body portion 111 sleeves an outer side of the second body portion 112 along a circumferential direction of the second body portion 112. The first insulation member 3 is arranged along a circumferential direction of the main body portion 2, which may have a hollow cylindrical structure and be configured for heat preservation along a circumferential direction of the single-crystal furnace.

The annular first body portion 111 can be easily connected to the first insulation member 3, thereby facilitating the support of the first insulation member 3, so that the lifting device 4 can drive the first insulation member 3 to move relative to the bottom plate assembly 1, so as to complete the installation of the first insulation member 3.

As shown in FIG. 8 and FIG. 7, in some embodiments, the bottom plate assembly 1 includes at least one installation hole 13. The installation hole 13 passes through the bottom plate assembly 1 along the height direction of the single-crystal furnace. The bottom plate assembly 1 is further provided with at least one air duct 14. The air duct 14 is installed on the bottom plate assembly 1 through the installation hole 13. The air duct 14 has one end communicated with the accommodating cavity 21 of the main body portion 2 arranged on the bottom plate assembly 1 and the other end communicated with the outside of the single-crystal furnace.

During crystal pulling, argon is generally introduced. The argon enters the single-crystal furnace and flows, and is discharged from the air duct 14. Oxides and other impurities produced during the crystal pulling are taken away by the flowing of the argon, thereby reducing the impact of the oxides and the other impurities on manufacturing and helping to improve the quality of the single-crystal silicon ingot, which is more in line with the actual use requirement.

As shown in FIG. 8, in some embodiments, the air duct 14 includes a first duct body 141 and a second duct body 142. The first duct body 141 sleeves an outer side of the second duct body 142, and the first duct body 141 and the second duct body 142 can move relatively along an axial direction of the air duct 14, so that the second duct body 142 can extend or retract relative to the first duct body 141.

Through this design, the air duct may have a telescopic structure. By adjusting a relative position between the first duct body 141 and the second duct body 142, a size of the air duct 14 along the axial direction thereof may be changed, that is, a length of the air duct 14 is changed, so that the air duct 14 can be adapted to bottom plate assemblies 1 with different thicknesses and single-crystal furnaces with different structures, which is more in line with the actual use requirement.

As shown in FIG. 7 and FIG. 8, in some embodiments, a hole wall of the installation hole 13 is provided with a first thread structure 131, and an outer wall of the air duct 14 is provided with a second thread structure 143. The first thread structure 131 and the second thread structure 143 fit each other, so that the air duct 14 is installed in the installation hole 13.

The threaded connection can facilitate installation and disassembly of the air duct 14. Compared with the solution in which the air duct 14 is clamped in the installation hole 13, in the solution of clamping, a gap easily exists between the air duct 14 and the installation hole 13, resulting in poor sealing performance of the entire single-crystal furnace. In some embodiments of the present disclosure, the threaded connection is adopted, and the thread structures are arranged along circumferential directions of the installation hole 13 and the air duct 14 respectively, thereby helping to improve sealing performance at a junction between the installation hole 13 and the air duct 14, which is more in line with the actual use requirement.

The first duct body 141 sleeves an outer side of the second duct body 142, and the second thread structure 143 of the air duct 14 may be arranged on an outer side of the first duct body 141.

As shown in FIG. 8, in some embodiments, the bottom plate assembly 1 is provided with at least two installation holes 13, the single-crystal furnace includes at least two air ducts 14, and the air ducts 14 are arranged in the corresponding installation holes 13.

Through the arrangement of the at least two air ducts 14, it may be more convenient for gas to be discharged along the air ducts, which is more in line with the actual use requirement.

In some embodiments, the single-crystal furnace includes two air ducts 14, and the two air ducts 14 are arranged symmetrically with respect to an axis direction of the single-crystal furnace.

As shown in FIG. 8, in some embodiments, the single-crystal furnace further includes a second insulation member 15. The second insulation member 15 is located between the protective plate 11 and the body plate 12.

The second insulation member 15 is arranged at the bottom of the single-crystal furnace and configured for heat preservation at the bottom of the single-crystal furnace. The protective plate 11 may protect the second insulation member 15 at the same time, thereby reducing a possibility of corrosion of the second insulation member 15 by overflowing silicon liquid and silicon vapor, and is configured to prolong the service life of the second insulation member 15, which is more in line with the actual use requirement.

In some embodiments, the connecting member 42 can move relative to the installation member 41 along the height direction of the single-crystal furnace. The connecting member 42 may be driven through a driving member such as a motor to move relative to the installation member 41.

Through this design, the position of the first insulation member 3 may be automatically adjusted through the lifting device 4, so as to be applied to single-crystal furnaces with different structures.

As shown in FIG. 7, in some embodiments, the connecting member 42 includes a first connecting portion 421 and a second connecting portion 422. The first connecting portion 421 and the second connecting portion 422 are connected, and there is an included angle between the first connecting portion 421 and the second connecting portion 422. The first connecting portion 421 is configured to fit the installation member 41, so that the connecting member 42 can move along the installation member 41. The second connecting portion 422 is configured to be connected to the second insulation member 15, which may be connected directly or indirectly.

This design can facilitate a connection between a moving portion and the first insulation member 3. The first connecting portion 421 and the second connecting portion 422 may be perpendicular to each other, and the second connecting portion 422 is located below the first insulation member 3. This design enables the second connecting portion 422 to support the first insulation member 3 and facilitate lifting of the first insulation member 3.

As shown in FIG. 7, in some embodiments, the second connecting portion 422 may be annular and be connected to a plurality of first connecting portions 421, and the first connecting portions 421 are connected to a same second connecting portion 422. At the same time, the first connecting portions 421 fit corresponding guiding portions.

Through the arrangement of the plurality of first connecting portions 421, during lifting or lowering, a force on the first insulation member 3 may be relatively uniform, thereby helping to improve stability of lifting or lowering of the first insulation member 3 by the lifting device 4 and being more in line with the actual use requirement.

As shown in FIG. 7, in some embodiments, the first connecting portions 421 are arranged at equal intervals along a circumferential direction of the second connecting portion 422, and the guiding portions are arranged corresponding to the first connecting portions 421.

This design is conducive to further improving the stability of driving of the first insulation member 3 by the lifting device 4, which is more in line with the actual use requirement.

In some embodiments, the guiding portion is provided with a U-shaped hole, and the first connecting portion 421 and the second connecting portion 422 fit through the U-shaped hole. The U-shaped hole makes it easy to adjust the position of the first connecting portion 421 to change the position of the first insulation member 3, so that the first insulation member 3 can adapt to single-crystal furnaces with different structures to improve a scope of application.

The guiding portion may be connected to the main body portion 2 through a bolt, and the main body portion 2 is a furnace cylinder of the single-crystal furnace. In some embodiments of the present disclosure, through the arrangement of the protective plate 11 on the bottom plate assembly 1, the bottom plate assembly 1 can be protected, and the first body portion 111 of the protective plate 11 can drive the first insulation member 3 to rise and fall along with the connecting member 42. The second body portion 112 is configured to protect the second insulation member 15 and the body plate 12. During the rising and falling of the first insulation member 3, the second body portion 112 is relatively stationary. That is, except the first body portion 111, other structures of the bottom plate assembly 1 can form a relatively fixed and closed structure, thereby reducing a possibility of corrosion of the second insulation member 15 and the body plate 12 by silicon vapor and overflowing silicon liquid. During disassembly and cleaning, the second body portion 112 and the structure therebelow are not disassembled, which is conducive to ensuring consistency of a bottom structure of the single-crystal furnace. During unscrewing of the main body portion 2, the first insulation member 3 is driven by the lifting device 4 to be lifted together. After the cleaning, the first insulation member 3 is restored together with the main body portion 2 to improve structural consistency of the single-crystal furnace used in machining of each batch, which is more in line with the actual use requirement.

When the first insulation member 3 is installed, the first insulation member 3 may be placed on the connecting member 42 and move together with the main body portion 2 in a direction close to the bottom plate assembly 1, and the first insulation member 3 reaches an installation position before the main body portion 2. That is, the first insulation member 3 is first installed in place, the main body portion 2 continues to move in the direction close to the bottom plate assembly 1, the connecting member 42 is detached from the first insulation member 3, and the main body portion 2 continues to move until the main body portion 2 is installed in place. During the disassembly, the main body portion 2 moves in a direction away from the bottom plate assembly 1, and the connecting member 42 abuts against the first body portion 111, is indirectly connected to the first insulation member 3 through the first body portion 111, and continues to move with the main body portion 2. The connecting member 42 can drive the first body portion 111 and the first insulation member 3 to move in a direction away from the bottom plate assembly 1, so that the first insulation member 3 and the main body portion 2 can be disassembled at the same time. That is, during installation and disassembly, strokes of the main body portion 2 and the lifting device 4 are greater than a stroke of the first insulation member 3.

This design enables the lifting device 4 to be detached from the first insulation member 3 after the first insulation member 3 is installed in place, thereby reducing a possibility of transfer of heat to a lifting assembly through contact heat transfer during the use of the single-crystal furnace and reducing heat transfer efficiency, which can reduce an influence of a high temperature on the lifting device 4. Moreover, since the strokes of the main body portion 2 and the lifting device 4 are greater than the stroke of the first insulation member 3, after the first insulation member 3 is installed in place, the main body portion 2 and the lifting device 4 may continue to move. That is, during the installation of the main body portion 2, the first insulation member 3 can be automatically detached from the lifting device 4, so the first insulation member 3 can be installed to single-crystal furnaces with different structures.

Compared with the single-crystal furnace not provided with the protective plate 11 and the lifting device 4, the single-crystal furnace provided in some embodiments of the present disclosure may be restored to 90% after disassembly and cleaning. A difference between heats is small, with an error within +1 mm. Besides, the service life of the bottom structure of the single-crystal furnace has also been prolonged. The service life may be prolonged by 50%, and crystal pulling power consumption is lowered by 2 kw to 3 kw. Moreover, a degree of automation during the disassembly and cleaning can be increased, 40% of a manual workload can be taken over, and disassembly and cleaning time can be saved by 30 minutes to 40 minutes, which helps to improve production efficiency and is more in line with the actual use requirement.

A crystal pulling process generally includes charging, melting, seeding, shoulder expanding/shoulder turning, equal diameter, finishing, and furnace shutdown and ingot removal steps. Prior to the equal diameter step, the upper edge of the crucible 7 is located 90 mm to 100 mm below the upper edge of the heating element 5. From the equal diameter process until completion of crystal pulling of a single silicon ingot, the position of the crucible 7 gradually rises. Generally, to pull a single single-crystal silicon ingot, the crucible 7 rises by 290 mm to 330 mm, and after the pulling of the single single-crystal silicon ingot, the upper edge of the crucible 7 drops again to a position of 90 mm to 100 mm from the upper edge of the heating element 5. Moreover, the above steps are repeated during the crystal pulling. After completion of pulling of the last single-crystal silicon ingot, the crucible 7 rises by 680 mm. A height of the crucible 7 is h. During the rising of the crucible 7, a rising speed is 4 mm/h to 10 mm/h.

Some embodiments of the present disclosure provide a single-crystal furnace. The single-crystal furnace includes a bottom plate assembly, a first insulation member 3, and a lifting device 4. The first insulation member 3 is arranged in the accommodating cavity 21 of the main body portion 2. The lifting device 4 includes an installation member 41 and a connecting member 42. The installation member 41 is mounted on the main body portion 2 through a threaded connection. The connecting member 42 is configured to be connected to the first insulation member 3. When the main body portion 2 moves relative to the bottom plate assembly 1, the first insulation member 3 may be driven by the lifting device 4 to move. Through the installation of the lifting device 4 in the single-crystal furnace, the first insulation member 3 may be disassembled together with the main body portion 2, which is more convenient during disassembly and cleaning. Moreover, during installation of the first insulation member 3 and disassembly of the first insulation member 3, a relative position between the first insulation member 3 and the main body portion 2 is relatively fixed, which can improve position accuracy of the first insulation member 3 and reduce the impact of disassembly and other operations on the position accuracy of the first insulation member 3, thereby helping to improve consistency between heats, which is more in line with the actual use requirement.

Figure 9:
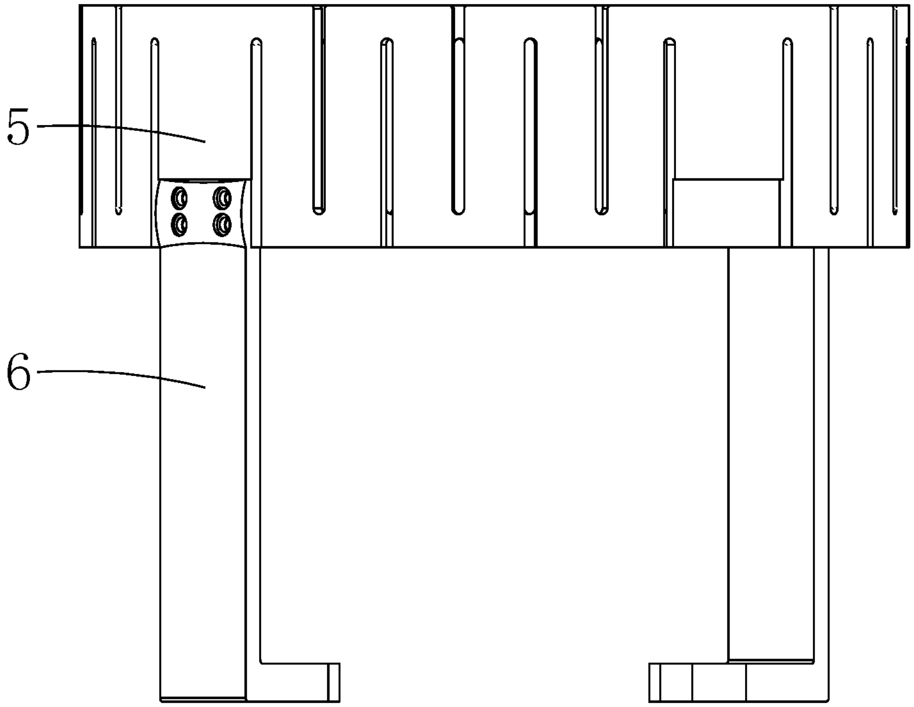
FIG. 9 is a schematic diagram of a heating member and a foot plate according to the present disclosure.
Figure 10:
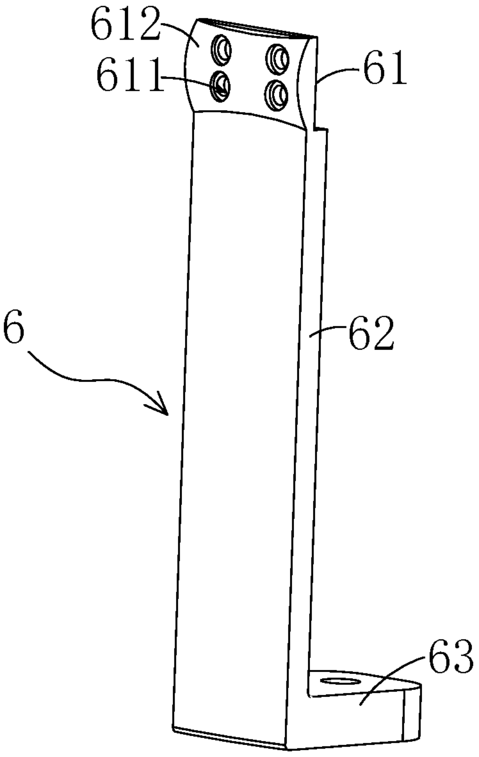
FIG. 10 is a schematic diagram of the foot plate according to the present disclosure.

As shown in FIG. 9 and FIG. 10, some embodiments of the present disclosure provide a single-crystal furnace. The single-crystal furnace includes a heating member 5 and a foot plate connected to each other. Along a height direction of the single-crystal furnace, the heating member 5 has a size of 850 mm to 970 mm. The heating member 5 is annular and may approximately have a hollow cylindrical structure. The foot plate includes a first connecting section 61. The first connecting section 61 is connected to the heating member 5. The first connecting section 61 has a protruding portion 612 on a side away from the heating element 5.

Generally, a height of the heating element 5 in the single-crystal furnace is 800 mm. In the solution provided in some embodiments of the present disclosure, the size of the heating element 5 along the height direction of the single-crystal furnace is increased. The size of the heating element 5 may be 850 mm, 860 mm, 870 mm, 880 mm, 890 mm, 900 mm, 910 mm, 920 mm, 930 mm, 940 mm, 950 mm, 960 mm, 970 mm, or the like. Compared with the conventional heating member 5, in the solution provided in some embodiments of the present disclosure, the size of the heating element 5 is increased by 50 mm to 170 mm. Due to the increase in the size of the heating element 5, a connection position between the foot plate and the heating element 5 is easily damaged, which affects normal use of the single-crystal furnace. In the solution provided in some embodiments of the present disclosure, through the arrangement of the protruding portion 612 on the side of the first connecting section 61 away from the heating member 5, a thickness of the first connecting section 61 can be increased, so that the first connecting section 61 can be reinforced. The protruding portion 612 may function as a reinforcing rib, thereby reducing a possibility of damages to the connection position between the foot plate and the heating element 5, which is conducive to prolonging the service life of the foot plate.

In some embodiments, along a direction away from the heating element 5, a thickness of the protruding portion 612 is a, and 3 mm≤a≤10 mm.

The thickness of the protruding portion 612 may be 3 mm, 3.5 mm, 4 mm, 4.5 mm, 5 mm, 5.5 mm, 6 mm, 6.5 mm, 7 mm, 7.5 mm, 8 mm, 8.5 mm, 9 mm, 9.5 mm, or 10 mm. When the thickness of the protruding portion 612 is excessively small, a reinforcing effect on the first connecting section 61 is weak, and a requirement for strength at the connection position between the foot plate and the heating element 5 cannot be met. When the thickness of the protruding portion 612 is excessively large, the protruding portion 612 may easily interfere with other structures in the single-crystal furnace. Therefore, the thickness of the protruding portion 612 is 3 mm to 10 mm, so as to meet the requirement for strength at the connection position between the foot plate and the heating element 5 and also reduce a possibility of interference of the protruding portion 612 with the other structures in the single-crystal furnace.

As shown in FIG. 10, in some embodiments, a surface on the side of the protruding portion 612 away from the heating element 5 is an arc-shaped surface.

Compared with the protruding portion 612 having a structure such as a rectangle, the protruding portion 612 having the arc-shaped surface can reduce occurrence of sharp corners, thereby helping to reduce stress concentration on the protruding portion 612 and reducing a possibility of damages to the protruding portion 612 due to collision. Moreover, a possibility of puncturing of other structures of the single-crystal furnace caused by collision of the protruding portion 612 with the other structures can also be reduced, which is more in line with the actual use requirement.

In some embodiments, the first connecting section 61 is bonded to the heating element 5.

Through bonding, a force at the connection position between the first connecting section 61 and the heating element 5 can be more uniform, thereby helping to reduce the influence of stress between the first connecting section 61 and the heating element 5, to reduce a possibility of damages to the first connecting section 61 and the heating element 5. It is conducive to improving stability of the connection between the first connecting section 61 and the heating element 5, and is also conducive to prolonging the service life of the foot plate 6 and the heating element 5.

Figure 11:
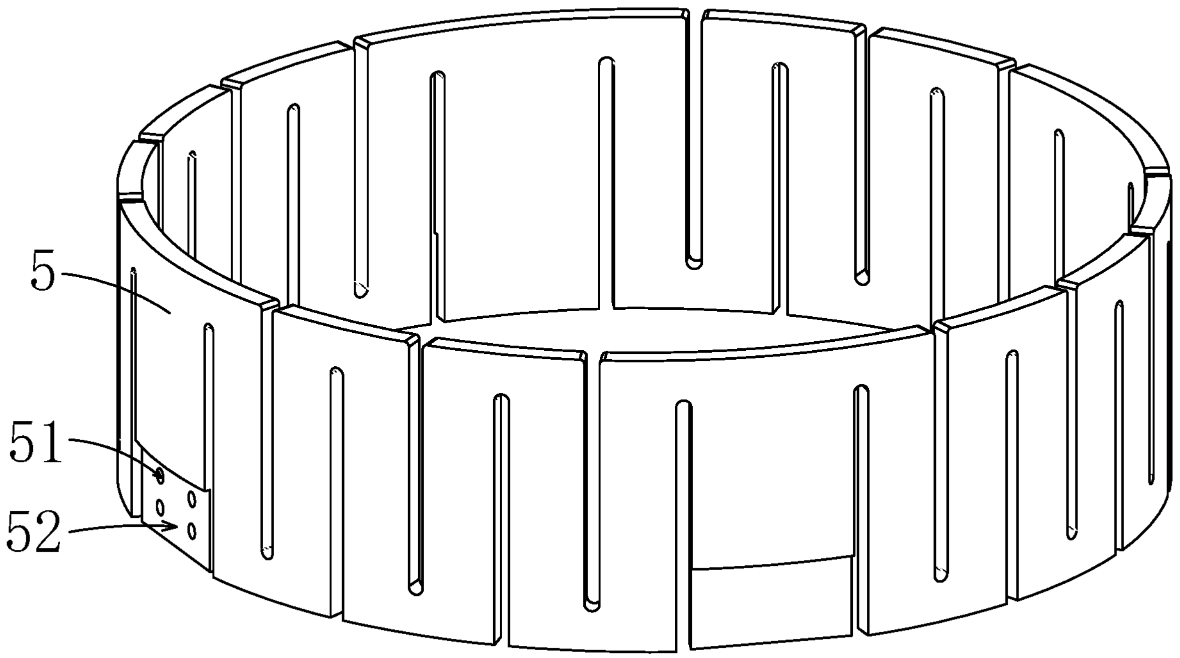
FIG. 11 is a schematic diagram of the heating member according to the present disclosure.

As shown in FIG. 10 and FIG. 11, in some embodiments, the first connecting section 61 has a first connecting hole 611, and the heating member 5 is provided with a second connecting hole 51. The single-crystal furnace includes a connecting member. The connecting member is configured to connect the first connecting hole 611 and the second connecting hole 51, so that the foot plate is installed on the heating member 5.

This design makes it easy to install and disassemble the bottom plate. When the foot plate or the heating element 5 is damaged and required to be replaced, both can be disassembled and replaced with corresponding parts for continued use.

As shown in FIG. 10 and FIG. 11, in some embodiments, the first connecting section 61 has at least two first connecting holes 611, the heating member 5 has at least two second connecting holes 51, and the first connecting holes 611 are respectively communicated with the corresponding second connecting holes 51.

This design helps to improve stability of the connection between the heating element 5 and the foot plate, and is more in line with the actual use requirement.

In some embodiments, the first connecting section 61 and the heating member 5 may be connected through bonding and a connecting member at the same time. This design helps to improve stability of the connection between the foot plate and the heating element 5 and reduce a possibility of detachment of the foot plate from the heating element 5.

As shown in FIG. 10, in some embodiments, the foot plate includes a body section 62, the first connecting section 61 is connected to the body section 62, and along a radial direction of the heating member 5, a thickness of the first connecting section 61 is less than that of the body section 62.

Through this design, the foot plate can form a step structure by utilizing a thickness difference between the first connecting section 61 and the body section 62, so that, when the foot plate and the heating element 5 are installed, the heating element 5 is limited through the step structure to improve accuracy of a relative position between the two, thereby helping to improve stability of the installation.

As shown in FIG. 10, an end of the body section 62 away from the first connecting section 61 has a second connecting section 63, there is an included angle between the body section 62 and the second connecting section 63, and the second connecting section 63 is configured to be connected to an electrode.

This design can facilitate the connection between the foot plate and the electrode, so that the heating element 5 can be electrically connected to the electrode through the foot plate.

As shown in FIG. 11, in some embodiments, an outer wall of the heating element 5 is provided with a limiting groove 52, the limiting groove 52 is recessed inward along a radial direction of the heating element 5, and along the height direction of the single-crystal furnace, a lower end of the limiting groove 52 passes through the heating element 5. At least part of the first connecting section 61 is located in the limiting groove 52. Along a height direction of the heating element 5, the body section 62 abuts against the heating member 5.

The body section 62 abuts against the heating member 5, and a relative position between the heating element 5 and the foot plate can be limited along an axis direction of the heating element 5. The relative position of the first connecting section 61 can be limited by the limiting groove 52, so that accuracy of the relative position between the foot plate and the heating element 5 can be further improved, thereby improving stability of the connection between the foot plate and the heating element 5.

In some embodiments, the protruding portion 612 is integrally formed with the first connecting section 61.

During machining of the foot plate, the protruding portion 612 may be formed at the same time, so that the step of connecting the protruding portion 612 and the first connecting section 61 can be saved. Moreover, the machining by integral formation has a better reinforcing effect on the first connecting section 61, which can further improve the stability of the connection between the foot plate and the heating element 5, reduce a possibility of damages to the foot plate, help to prolong the service life of the foot plate, and be more in line with the actual use requirement.

In some embodiments, the foot plate may be made of a carbon material.

The carbon material has high strength and rigidity, and is relatively lightweight. At the same time, the carbon material also has good electrical conductivity, so that the foot plate may be configured to connect the heating element 5 and the electrode. Better thermal insulation of the carbon material can be used in the single-crystal furnace, thereby reducing the possibility of damages to the foot plate caused by a rising temperature in the furnace in use, which is more in line with the actual use requirement.

In some embodiments, along the height direction of the single-crystal furnace, a height of the heating member 5 is m, a height of the crucible of the single-crystal furnace is n, and $1.0625 \leq m/n \leq 1.62$.

In some embodiments, the height of the heating member 5 may be 850 mm to 970 mm. The height of the heating member 5 may be 850 mm, 860 mm, 870 mm, 880 mm, 890 mm, 900 mm, 910 mm, 920 mm, 930 mm, 940 mm, 950 mm, 960 mm, 970 mm, or the like.

A size of the heating member 5 may be proportional to a size of the crucible. When the depth of the crucible is larger, the size of the heating element 5 is also relatively larger. This design can facilitate the heating of the crucible by the heating element 5, thereby helping the crucible to be heated evenly and improving heating efficiency.

In the solution provided in some embodiments of the present disclosure, increasing the size of the heating element 5 can help improve the heating efficiency of the heating element 5. At the same time, the heating element 5 can be adapted to a larger-sized crucible, thereby helping to improve crystal pulling efficiency and being more in line with the actual use requirement.

As shown in FIG. 3, FIG. 3 shows process parameters for manufacturing a single-crystal silicon ingot. The size of the crucible is the depth of the crucible, and radial dimensions of the crucible in respective control groups and experimental groups are the same. Control Group 1 and Control Group 2 are conventional process parameters. The height of the heating member 5 is relatively small. In the solution provided in some embodiments of the present disclosure, by enlarging the size of the heating element 5 in the height direction, the heating efficiency of the heating element 5 can be improved. As can be seen from the control groups and the experimental groups, by use of the solution provided in some embodiments of the present disclosure, the heating element can be adapted to a larger-sized crucible, which is conducive to improving production efficiency of the single-crystal silicon ingot and reducing oxygen content in the single-crystal silicon ingot, thereby improving the quality of the single-crystal silicon ingot. By increasing the size of the heating element 5, a processing technology of the single-crystal silicon ingot can be improved, which is more in line with an actual manufacturing requirement. In some embodiments of the present disclosure, the first connecting section 61 of the foot plate 6 is provided with the protruding portion 612, so that a possibility of damages due to a reduction in structural strength at a connection position between the heating member 5 and the foot plate caused by an increase in the size of the heating member 5 can be reduced. The first connecting section 61 can be reinforced by the protruding portion 612, thereby reducing a possibility of damages to the foot plate 6 in use.

By comparing the control groups with the experimental groups, it can be concluded that, by use of process data provided in some embodiments of the present disclosure, the oxygen content in the single-crystal silicon ingot can be effectively reduced, thereby helping to improve product quality of the single-crystal silicon ingot. By comparing Experimental Group 2 with Experimental Group 4, it can be concluded that, under a condition that the size of the crucible 7, the retention rate, the retention amount, the furnace pressure, the flow rate of the argon, and the height of the heating element are definite, the greater the value of a/b, the lower the oxygen content in the machined single-crystal silicon ingot. By comparing Experimental Group 2 with Experimental Group 3, it can be concluded that, under a condition that the retention rate, the retention amount, and the height of the heating element are definite, increasing the flow rate of the argon has a more obvious effect on reducing the oxygen content in the single-crystal silicon ingot than increasing the ratio of a/b in the initial charging. Therefore, in actual machining, the ratio of a/b of the initial charging and the flow rate of the argon can be increased at the same time to further reduce the oxygen content in the single-crystal silicon ingot. By comparing Experimental Group 1 with Experimental Group 2, it can be concluded that, under a condition that the retention rate, the retention amount, the furnace pressure, and the flow rate of the argon are definite, increasing the size of the crucible 7 helps to increase the ratio of a/b of the initial charging and helps to reduce the oxygen content in the single-crystal silicon ingot.

Some embodiments of the present disclosure provide a single-crystal furnace. The single-crystal furnace includes a foot plate and a heating member 5. Along a height direction of the single-crystal furnace, the heating member 5 has a size of 850 mm to 970 mm. The foot plate includes a first connecting section 61. The first connecting section 61 is connected to an outer wall of the annular heating member 5, and the first connecting section 61 has a protruding portion 612 on a side away from the heating element 5. The arrangement of the protruding portion 612 on the first connecting section 61 can have a reinforcing effect on the first connecting section 61, so that structural strength of the first connecting section 61 can be improved, thereby improving stability of the connection between the foot plate 6 and the heating member 5 and being more in line with the actual use requirement.

What is claimed is:

1. A method for manufacturing a single-crystal silicon rod, wherein the single-crystal silicon rod is pulled through a single-crystal furnace which has a crucible (7) having a depth ranging from 680 mm to 800 mm, and the method comprises:

initially feeding a silicon material into the crucible (7), wherein a contact area between the silicon material in the crucible (7) and the crucible (7) is defined as a, and a contact area between a liquid level of the silicon material in the crucible (7) and furnace atmosphere is defined as b, where $3.0 \le a/b \le 3.9$.

2. The method according to claim 1, comprising: further feeding the crucible (7) with the silicon material when a/b satisfies $1.2 \le a/b \le 1.5$ during crystal pulling.

3. The method according to claim 1, wherein, after crystal pulling is completed, the silicon material has a crucible retention rate of 30% to 40%, and/or after a single crystal pulling is completed, the silicon material has a crucible retention amount ranging from 300 kg to 410 kg.

4. The method according to claim 1, wherein, when the silicon material is initially fed into the crucible (7), a layer of the silicon material with a linear width of 20 mm to 70 mm is firstly fed, the silicon material with a linear width of 70 mm to 210 mm is then fed, and the silicon material with a linear width of 20 mm to 70 mm is fed between the silicon material with the linear width of 70 mm and 210 mm and an inner wall of the crucible (7), such that a space between the silicon material with the linear width of 70 mm and 210 mm and an inner wall of the crucible (7) is filled with the silicon material with the linear width of 70 mm to 210 mm.

5. The method according to claim 4, wherein, when the silicon material is initially fed into the crucible (7), a layer of 40 kg to 90 kg of the silicon material with a linear width of 20 mm to 70 mm is firstly fed, 40 kg to 210 kg of the silicon material with a linear width of 70 mm to 210 mm is then fed, and the silicon material with the linear width of 20 mm to 70 mm is fed between the silicon material with the linear width of 70 mm and 210 mm and the inner wall of the crucible (7); and above steps are repeated until the initial feeding is completed.

6. The method according to claim 5, wherein when the steps of first charging a layer of 40 kg to 90 kg of the silicon material with a linear width of 20 mm to 70 mm, then charging 40 kg to 210 kg of the silicon material with a linear width of 70 mm to 210 mm, and charging the silicon material with the linear width of 20 mm to 70 mm between the silicon material of 70 mm and 210 mm and the inner wall of the crucible (7) are repeated, and mass of the silicon material with the linear width of 70 mm to 210 mm that is fed at each time gradually decreases.

7. The method according to claim 6, wherein, when the silicon material is initially charged into the crucible (7), charging is performed three times, mass of the silicon material with the linear width of 70 mm to 210 mm charged in the first charging is 140 kg to 200 kg, mass of the silicon material with the linear width of 70 mm to 210 mm charged in the second charging is 100 kg to 150 kg, and mass of the silicon material with the linear width of 70 mm to 210 mm charged in the third charging is 50 kg to 100 kg.

8. The method according to claim 5, wherein, when the steps of first charging a layer of 40 kg to 90 kg of the silicon material with a linear width of 20 mm to 70 mm, then charging 40 kg to 210 kg of the silicon material with a linear width of 70 mm to 210 mm, and charging the silicon material with the linear width of 20 mm to 70 mm between the silicon material of 70 mm and 210 mm and the inner wall of the crucible (7) are repeated, the linear width of the silicon material with the linear width of 70 mm to 210 mm charged each time gradually decreases.

9. The manufacturing method according to claim 8, wherein, when the silicon material is initially charged into the crucible (7), charging is performed three times, the silicon material of 70 mm and 210 mm in the first charging is blocks with a linear width of 70 mm to 210 mm, the silicon material of 70 mm and 210 mm in the second charging is blocks with a linear width of 70 mm to 150 mm, and the silicon material of 70 mm and 210 mm in the third charging is blocks with a linear width of 70 mm to 130 mm.

10. The manufacturing method according to claim 5, wherein, mass of the silicon material with the linear width of 70 mm to 210 mm charged each time gradually decreases.

11. The method according to 4, wherein the silicon material with the linear width of 20 mm to 70 mm accounts for 27% to 35% of a total amount of the silicon material that is initially fed.

12. The method according to claim 1, comprising:

melting the silicon material in the crucible (7), and adjusting the single-crystal furnace to a negative pressure state and introducing argon into the single-crystal furnace when the linear width of the silicon material is less than 150 mm.

13. The method according to 12 wherein, during the manufacturing, when the linear width of the silicon material is less than 150 mm, a furnace pressure of the single-crystal furnace is adjusted to 4 Torr to 8 Torr.

14. The method according to 12, wherein, during the manufacturing, when the linear width of the silicon material is less than 150 mm, a flow rate of the argon that is introduced is c, where $100\ \text{lmp} < c \le 150\ \text{lmp}$.

15. The method according to claim 1 wherein the single-crystal furnace comprises a heating element (5) and a crucible holder (8) configured to place the crucible (7), and after the silicon material is fed into the crucible (7), a contact area between the silicon material in the crucible (7) and the crucible (7) is a, a contact area between a liquid level of the silicon material in the crucible (7) and furnace atmosphere is b, and $1.2 \le a/b \le 3.7$, and the method comprises:

positioning the crucible holder (8) 200 mm below an upper edge of the heating element (5);

moving the crucible (7) into the single-crystal furnace; and lifting the crucible holder (8) until the crucible holder (8) abuts against the crucible (7).

16. The method according to 15, wherein moving the crucible (7) into the single-crystal furnace comprises:

extending an upper edge of the crucible (7) into an upper edge of a first insulation member of the single-crystal furnace by 50 mm to 130 mm.

17. A single-crystal furnace, comprising a crucible (7), wherein the crucible (7) has a depth ranging from 680 mm to 800 mm;

a main body portion (2), wherein the main body portion (2) has an accommodating cavity (21), and the crucible (7) is located in the accommodating cavity (21); and a bottom plate assembly (1), wherein the main body portion (2) is installed on the bottom plate assembly; and wherein along a height direction of the single-crystal furnace, the main body portion (2) comprises a first main body section (22), a second main body section (23), and a spacer (24), wherein the first main body section (22) is located on a side of the main body portion (2) close to the bottom plate assembly (1), the second main body section (23) is located on a side of the first main body section (22) away from the bottom plate assembly (1), and the spacer (24) is located between the first main body section (22) and the second main body section (23).

18. The single-crystal furnace according to claim 17, comprising a crucible holder (8), wherein the crucible holder (8) is configured to hold the crucible (7), and the crucible holder (8) and/or the crucible (7) are capable of moving along the height direction of the single-crystal furnace relative to the bottom plate assembly (1).

19. The single-crystal furnace according to claim 18, wherein the crucible holder (8) is capable of moving along the height direction of the single-crystal furnace relative to the bottom plate assembly (1), and along the height direction of the single-crystal furnace, the crucible holder (8) is positioned 200 mm below an upper edge of a heating element (5).

20. The single-crystal furnace according to claim 17, wherein the single-crystal furnace comprises a heating element (5), and along the height direction of the single-crystal furnace, the heating element (5) has a size of 850 mm to 970 mm.

* * * * *